(12) United States Patent
Goward et al.

(10) Patent No.: US 11,469,358 B1
(45) Date of Patent: Oct. 11, 2022

(54) FORMATION OF NANOPOROUS COPPER INTERCONNECT FOR ELECTRICAL CONNECTION

(71) Applicant: Meta Platforms Technologies, LLC, Menlo Park, CA (US)

(72) Inventors: John Michael Goward, Ayr (GB); James Ronald Bonar, Erskine (GB)

(73) Assignee: Meta Platforms Technologies, LLC, Menlo Park, CA (US)

( * ) Notice: Subject to any disclaimer, the term of this patent is extended or adjusted under 35 U.S.C. 154(b) by 0 days.

(21) Appl. No.: 16/279,887

(22) Filed: Feb. 19, 2019

(51) Int. Cl.
| | | |
|---|---|---|
| H01L 33/62 | (2010.01) |
| C23C 14/14 | (2006.01) |
| C23C 14/02 | (2006.01) |
| C25D 7/12 | (2006.01) |
| C25D 3/56 | (2006.01) |
| C25D 5/48 | (2006.01) |
| C23C 14/58 | (2006.01) |

(52) U.S. Cl.
CPC ............ *H01L 33/62* (2013.01); *C23C 14/021* (2013.01); *C23C 14/14* (2013.01); *C23C 14/58* (2013.01); *C25D 3/56* (2013.01); *C25D 5/48* (2013.01); *C25D 7/123* (2013.01)

(58) Field of Classification Search
CPC ....... H01L 33/62; C23C 14/021; C23C 14/14; C23C 14/58; C25D 3/56; C25D 5/48; C25D 7/123
USPC .......................................................... 257/99
See application file for complete search history.

(56) References Cited

U.S. PATENT DOCUMENTS

| | | | | |
|---|---|---|---|---|
| 2004/0188839 A1* | 9/2004 | Ohtsuka | ............ | H01L 21/76834 257/750 |
| 2007/0273012 A1* | 11/2007 | Ikuta | ................. | H01L 21/76838 257/675 |
| 2008/0191352 A1* | 8/2008 | Yu | ....................... | H01L 23/5226 257/E23.141 |
| 2008/0246154 A1* | 10/2008 | Lin | ......................... | H01L 24/12 257/759 |
| 2009/0160050 A1* | 6/2009 | Miyakawa | .............. | H01L 25/50 257/737 |
| 2014/0362267 A1* | 12/2014 | Kagawa | ............ | H01L 23/53223 348/302 |
| 2015/0184309 A1* | 7/2015 | Zhang | ....................... | C25F 3/02 205/662 |

(Continued)

*Primary Examiner* — Lex H Malsawma
*Assistant Examiner* — Eric W Jones
(74) *Attorney, Agent, or Firm* — Fenwick & West LLP

(57) ABSTRACT

Embodiments relate to nanoporous copper interconnects on a first body for electrically connecting to a second body. To fabricate the nanoporous copper interconnect, a zinc-copper alloy is deposited on recesses on the surface of the first body, and then the zinc is removed from the zinc-copper alloy to obtain nanoporous copper. The first body and the second body can be attached using bonding between oxide surfaces of the two bodies or be provided with underfill between the two bodies. The nanoporous copper electrically connects to an active layer or electrical components of the first body and the second bodies. Using nanoporous copper as interconnects is advantageous, among other reasons, because it can be formed at a low temperature, it is compatible with a standard complementary metal-oxide-semiconductor (CMOS) process, it provides good electrical conductivity, and it is less likely to cause issues due to migration of material.

5 Claims, 12 Drawing Sheets

Form one of more recesses on the surface of a first body for mounting a second body.
402

Deposit an alloy comprising copper and zinc on at least the recesses
403

Remove the zinc from the copper-zinc alloy to produce a nanoporous copper material on the recesses
404

(56) References Cited

U.S. PATENT DOCUMENTS

| | | | |
|---|---|---|---|
| 2015/0279802 A1* | 10/2015 | Onozuka | H01L 24/16 257/693 |
| 2016/0133584 A1* | 5/2016 | Mischitz | H01L 24/05 257/762 |
| 2017/0043399 A1* | 2/2017 | Ren | B22F 3/1121 |
| 2019/0040497 A1* | 2/2019 | Yushin | C22B 5/14 |

* cited by examiner

Form one of more recesses on the surface of a first body for mounting a second body.
402

Deposit an alloy comprising copper and zinc on at least the recesses
403

Remove the zinc from the copper-zinc alloy to produce a nanoporous copper material on the recesses
404

FORMATION OF NANOPOROUS COPPER INTERCONNECT FOR ELECTRICAL CONNECTION

BACKGROUND

The disclosure relates to interconnects between electronic components, and more specifically to interconnects made of nanoporous copper.

The technology of light emitting diodes (LEDs) has improved dramatically over recent years. One of the most recent and promising developments is in the subcategory of micro-LEDs, which are LEDs of sizes on the order of a few microns. Micro-LED displays offer better contrast, particularly at close ranges, since the pixels are only a few microns in size.

In order to mass produce micro-LED displays, interconnects on the size scale of microns are needed. Existing technology for interconnects are too bulky or too expensive at the micron scale. Emerging technology for nanoporous metals offer a solution to this problem.

Technology exists for nanoporous gold material, formed by selectively dealloying a gold-silver alloy. However, because of the high mobility of silver atoms dissolved in gold, the silver is likely to migrate from its original position in the gold lattice and cause short circuiting of the device. Furthermore, the components of the gold-silver alloy are expensive and thereby not cost efficiently scaled to mass production.

SUMMARY

Embodiments relate to assembling a first body with a second body using nanoporous copper material to electrically connect conductive materials in the first body and the second body. Recesses are formed on a top surface of a first body for mounting a second body. The recesses are electrically connected to electronic elements in the first body via interconnects in the inactive layer. An alloy includes copper and zinc that is formed at least in the recesses. The zinc is removed from the deposited alloy to produce a nanoporous copper material on the recesses.

In one or more embodiments, the deposited alloy and the top surface are planarized after depositing the alloy.

In one or more embodiments, the nanoporous copper material is collapsed into the recesses by pushing electrodes of the second body into the recesses.

In one or more embodiments, an oxide layer on the top surface of the first body engages with an oxide layer on a bottom surface of the second body.

In one or more embodiment, the nanoporous copper material protrudes from the recesses.

In one or more embodiments, the nanoporous material is collapsed by electrodes of the second body coming into contact with the nanoporous material.

In one or more embodiments, the first body and the second body are secured by underfill after collapsing the nanoporous material.

In one or more embodiments, an active layer is formed on a substrate. The electronic elements includes at least portions of the active layers. The first body is obtained by forming the inactive layer on the active layer.

In one or more embodiments, a seed layer is deposited on the top surface formed with recesses for depositing the alloy.

DETAILED DESCRIPTION

Embodiments relate to nanoporous copper interconnects on a first body (e.g., a substrate) for electrically connecting to a second body (e.g., a chip die). To fabricate the nanoporous copper interconnect, a zinc-copper alloy is deposited on recesses on the surface of the first body, and then the zinc is removed from the zinc-copper alloy to obtain nanoporous copper. The first body and the second body can be attached using bonding between oxide surfaces of the two bodies or be provided with underfill between the two bodies. The nanoporous copper electrically connects to an active layer or electrical components of the first body and the second bodies. Using nanoporous copper as interconnects is advantageous, among other reasons, because it can be formed at a low temperature, it is compatible with a standard complementary metal-oxide-semiconductor (CMOS) process, it provides good electrical conductivity, and it is less likely to cause issues due to electro-migration of material.

A body as described herein refers to a physical entity comprising one or more conductive traces. The conductive traces may be part of interconnects, transistors or other discrete electronic devices. Examples of the body include, among others, a substrate (e.g., a silicon substrate) or a discrete electronic component (e.g., an integrated circuit).

Figure 1A:
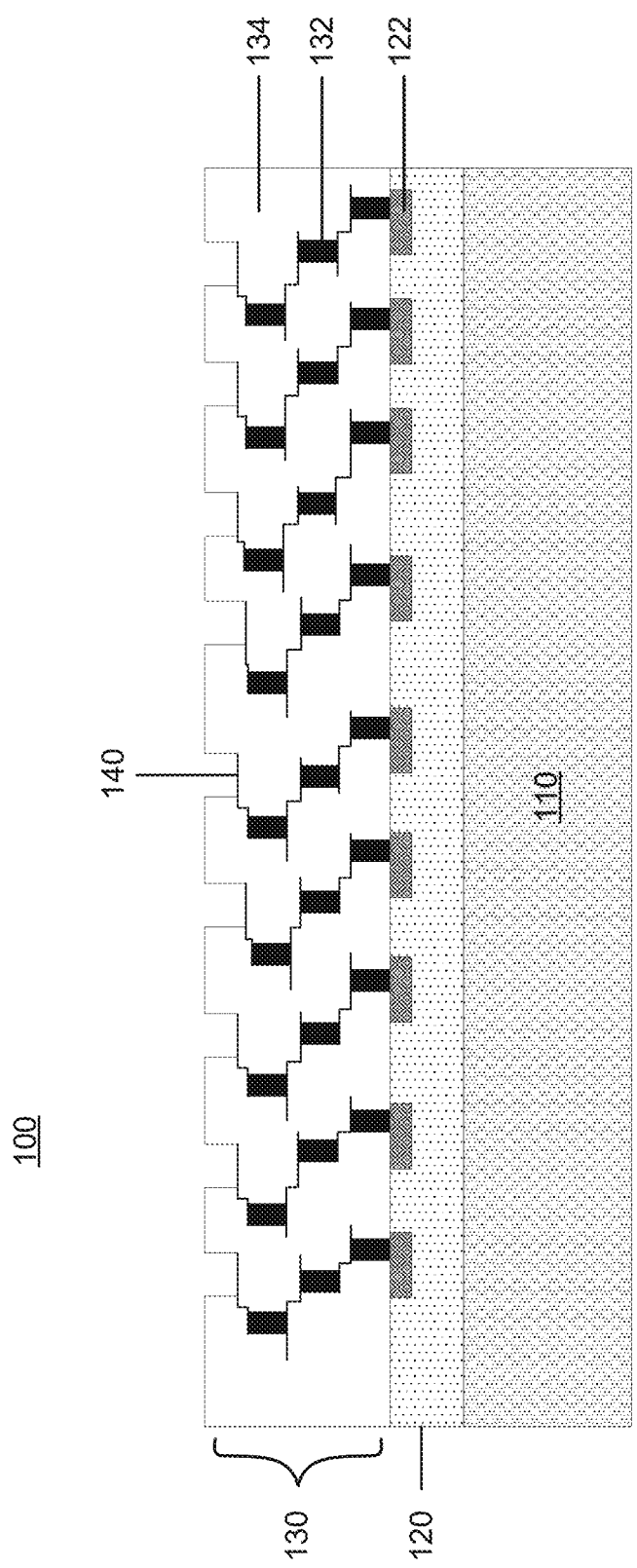
FIG. 1A is a cross-sectional diagram of a first body with an active layer and an inactive layer, according to one embodiment.

FIG. 1A is a cross-sectional diagram of a first body 100 with an active layer 120 and an inactive layer 130, according to one embodiment. The first body 100 may be a substrate. The first body further comprises a bulk layer 110 on which the active layer 120 and the inactive layer 130 are placed. These layers are ordered such that the bulk layer 110 is in contact with the active layer 120. The active layer 120 is in contact with the inactive layer 130.

More specifically, the bulk layer 110 may be made of silicon. The active layer 120 may contain electronic components 122 such as transistors, resistors, and capacitors. An example of the active layer 120 is a front end of line (FEOL) layer. The inactive layer 130 further comprises a matrix of insulating materials 134 and conductive interconnects 132, and may have an oxide layer on the exterior surface. An example of an inactive layer 130 is a back end of line (BEOL) layer. The conductive interconnects may be made from copper in the inactive layer 130, for example, using a damascene process that is well known in the art. The active layer 120 may be in contact with the inactive layer 130 such that at least some of conductive interconnects 132 make electrical contact with at least some electronic components 122.

Recesses 140 are formed on the surface of the substrate, and more specifically on the surface of the inactive layer 130. In embodiments where there is an oxide layer on the surface of the inactive layer, the recesses are etched through the oxide. At least some of the recesses 140 are in electrical contact with the conductive interconnects 132. The recesses 140 may be formed by etching the surface of the first body 100, involving a single damascene process or a dual damascene process.

Figure 1B:
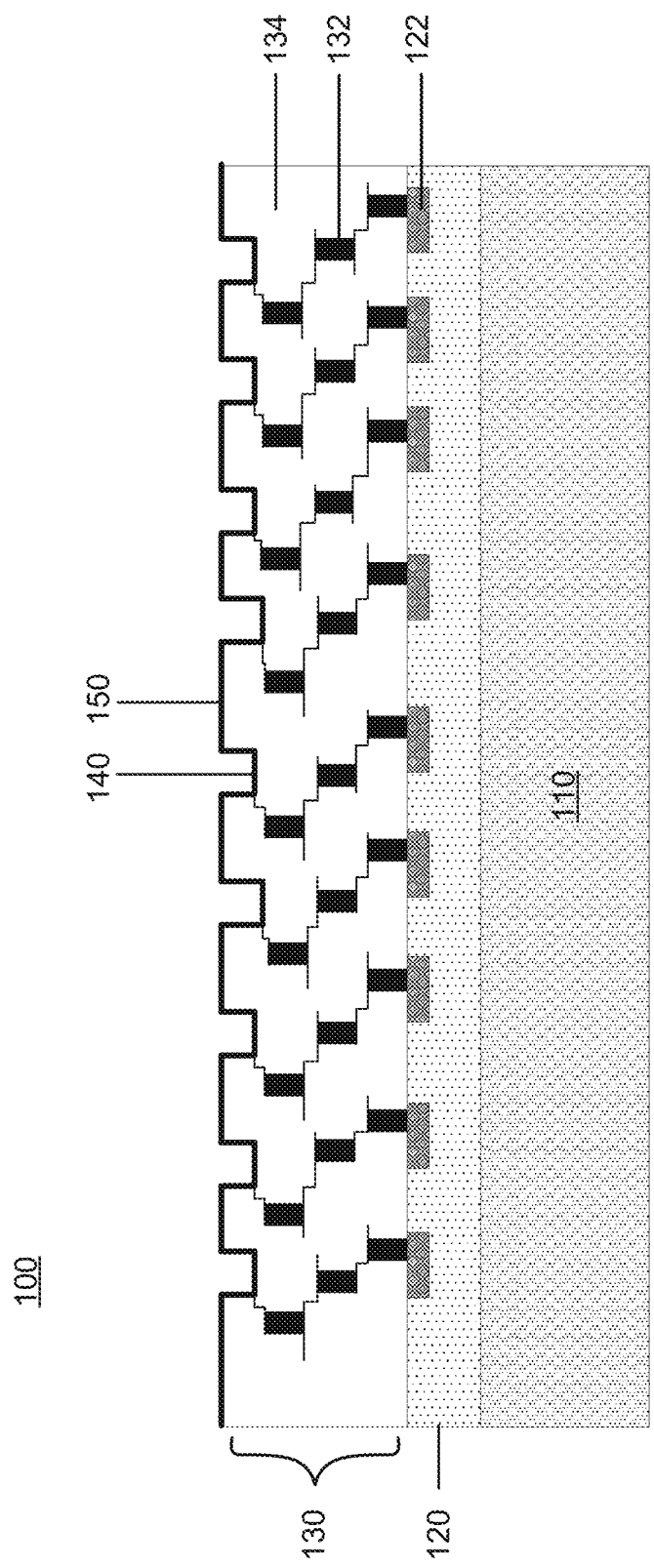
FIG. 1B is a cross-sectional diagram of the first body with a seed layer deposited on the inactive layer, according to one embodiment.

FIG. 1B is a cross-sectional diagram of the first body 100 with a copper seed layer 150 deposited on the inactive layer, according to one embodiment. The seed layer 150 covers the recesses 140 and the top surface of the inactive layer 130.

Figure 1C:
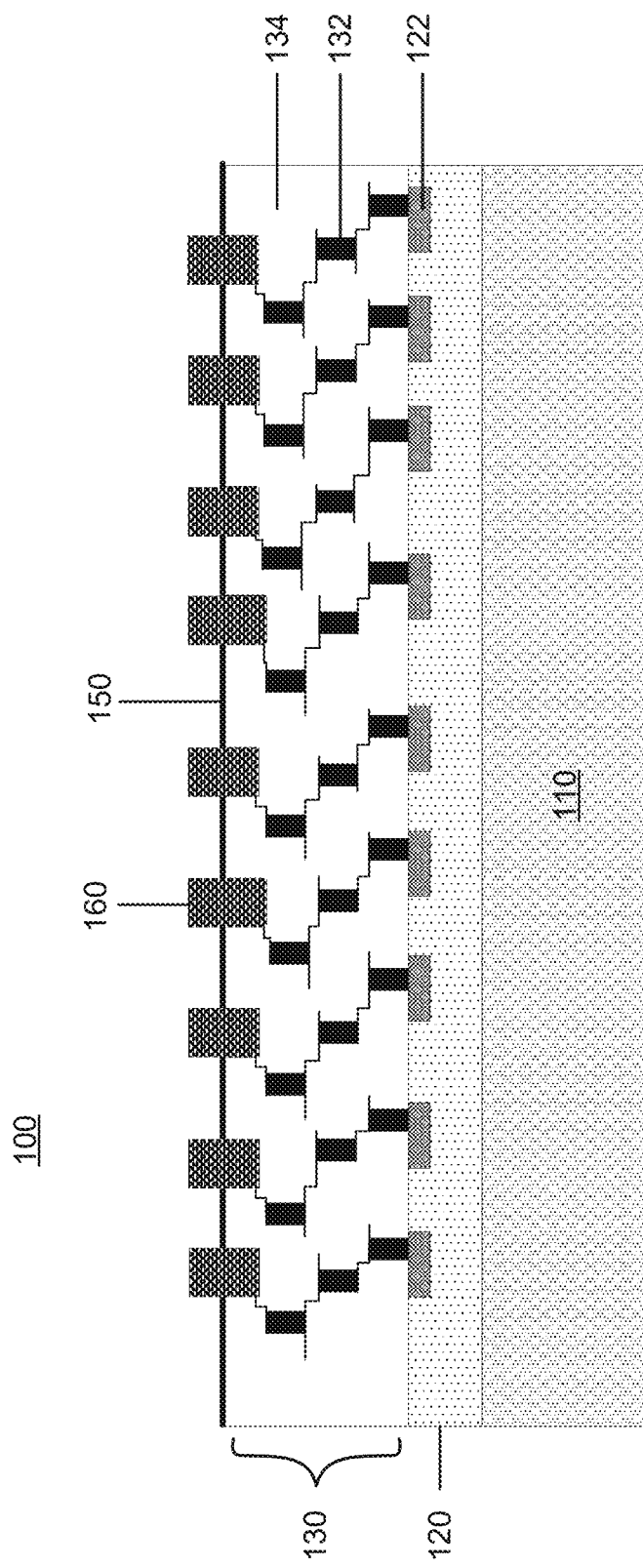
FIG. 1C is a cross-sectional diagram of the first body with a copper-zinc alloy deposited on the inactive layer, according to one embodiment.

The copper seed layer 150 facilitates the growth of additional material. The seed layer 150 may be sputter deposited, thermal evaporation or any other known vacuum deposition process. The seed layer 150 is generally removed or inactivated after the depositing of additional material is complete. Typically for these small dimensions a dry etch process is used FIG. 1C is a cross-sectional diagram of the first body 100 with a copper-zinc alloy deposited on the inactive layer 130, according to one embodiment. In other embodiments, copper alloyed to other metals are used. The zinc-copper alloy 160 is deposited using electrochemical deposition techniques such as dc or reverse pulse plating on the top surface of the first body 100 and in the recesses 140. The proportion of copper in the deposited co-alloy is in the range of 20% to 50%. After depositing, the copper-zinc alloy 160 may protrude from the recesses and the surface of the active layer 130. The copper-zinc alloy 160 is connected to the electronic components 122 in the active layer 120 via the conductive interconnects 132 in the inactive layer 130.

In some embodiments, the surface of the inactive layer is not planarized. The copper-zinc alloy 160 remains protruding from the surface of the inactive layer 130, similar to the embodiment of FIG. 1C. When the surface is not planarized, ion beam milling or reactive ion etching may be used to remove the seed layer between the deposited copper co-alloy features. In other embodiments, the surface of the inactive layer is planarized, similar to the embodiment of FIG. 1D. In the planarized surface, the seed layer on the top surface of the inactive layer 130 is removed. Ion beam etch may be obviated where the seed layer is removed during planarization of the surface.

Figure 1D:
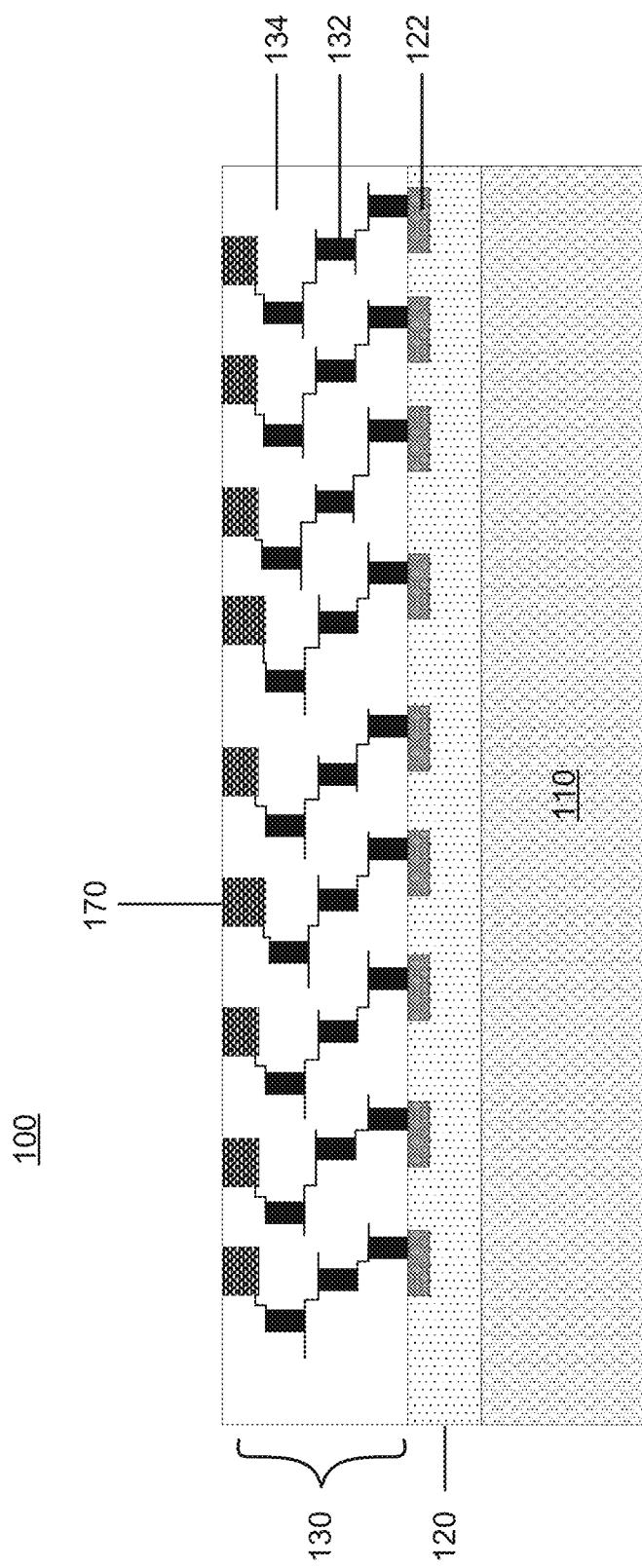
FIG. 1D is a cross-sectional diagram of the first body with the copper-zinc alloy deposited on the inactive layer and the surface of the inactive layer planarized, according to one embodiment.

FIG. 1D is a cross-sectional diagram of the first body 100 with the copper-zinc alloy 160 deposited on the inactive layer 130 and the surface of the inactive layer 130 planarized, according to one embodiment. The surface 170 may be planarized by various methods such as chemical-mechanical planarization (CMP) or planar diamond cutting. During planarization, the seed layer on the top of the first body 100 may be removed.

Figure 1E:
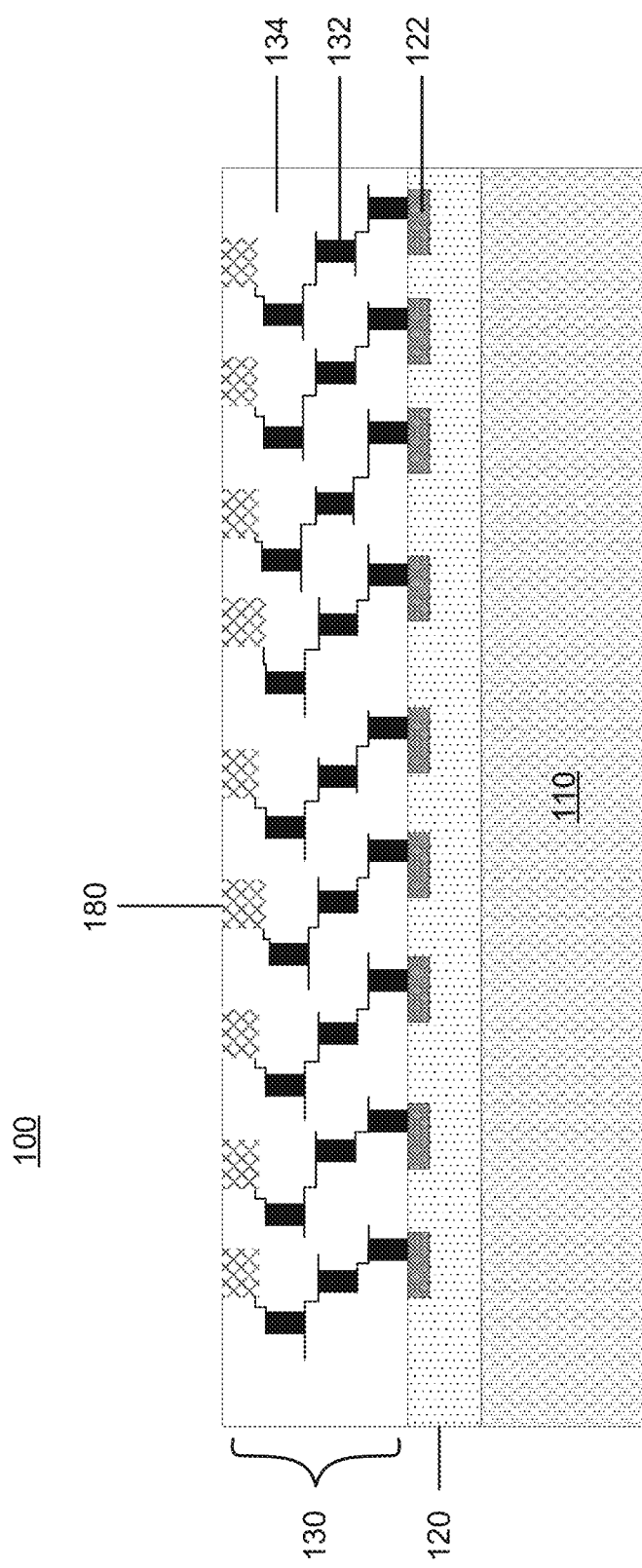
FIG. 1E is a cross-sectional diagram of the first body with nanoporous copper deposits that are planarized, according to one embodiment.

FIG. 1E is a cross-sectional diagram of the first body 100 with nanoporous copper deposits 180 where the top surface of the first body 100 is planarized, according to one embodiment. The zinc in the zinc-copper alloy 160 is removed, leaving the nanoporous copper 180. When the zinc atoms are removed from the deposited co-alloy, the copper atoms will rearrange themselves at an adatom level to form the ligand structures associated with the resulting nanoporous copper. This results in a continuous copper ligand interlinking that is porous. The diameters of the ligands of the nanoporous copper 180 are on the scale of a few nanometers to a few microns. The nanoporous copper 180 is electrically conductive.

Figure 1F:
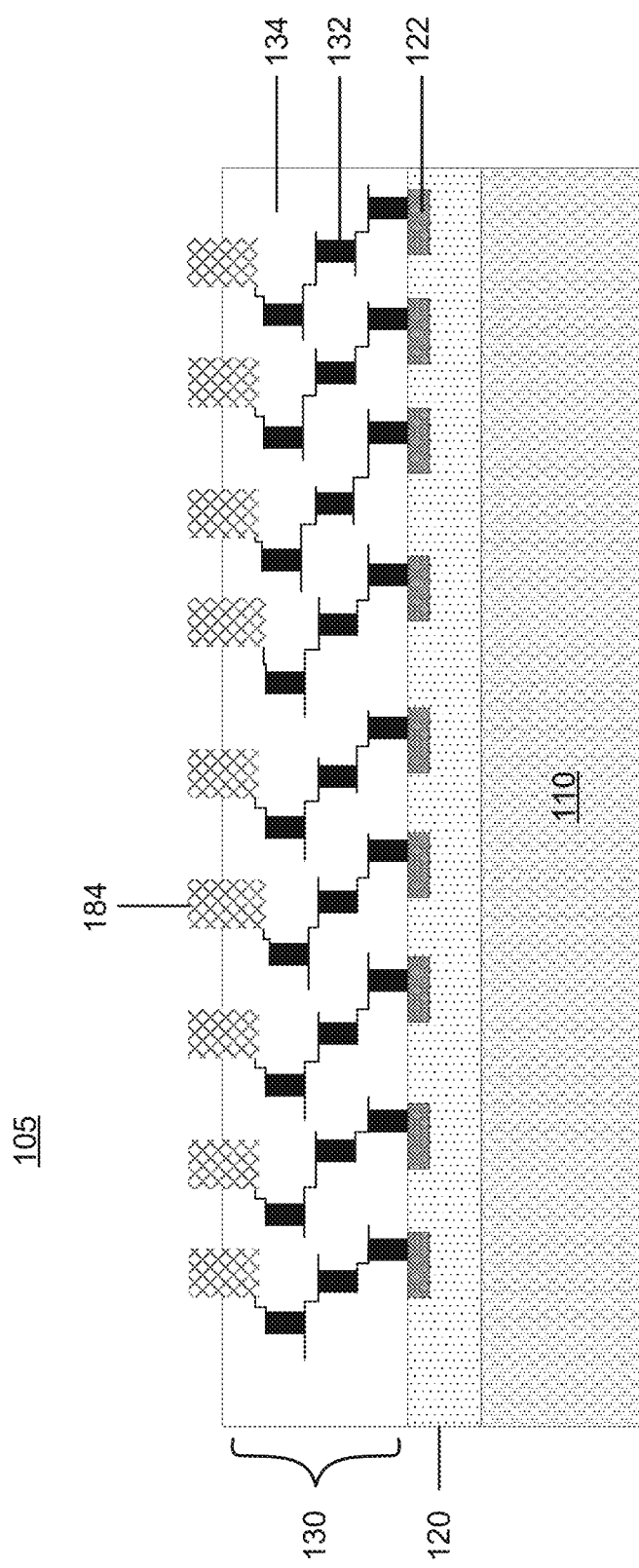
FIG. 1F is a cross-sectional diagram of the first body with nanoporous copper deposits that are not planarized, according to one embodiment.

In some embodiments, the zinc is removed from the zinc-copper alloy 160 by a dealloying process, also known as selective leaching. There are various dealloying processes that selectively remove one or more metals from an alloy in a controlled manner. A common method for dealloying is galvanic corrosion. Zinc is more anodic than copper. When a zinc-copper alloy is submerged in an electrolyte, the zinc will corrode and dissolve into the solution. In some embodiments, galvanic corrosion of the zinc-copper alloy 160 may be used to produce the nanoporous copper 180. Alternatively, a simple acid etch using hydrochloric acid (HCL) will also remove the zinc and allow the formation of the nanoporous copper. Critical to the ligand structure is the time and temperature to remove the zinc by acid etch, FIG. 1F is a cross-sectional diagram of a first body 105 with nanoporous copper deposits 184 where the top surface of the inactive layer 130 is not planarized, according to one embodiment. The embodiment of FIG. 1F is different from the embodiment of FIG. 1E in that the nanoporous copper 184 is not planarized, and therefore, the nanoporous copper 184 protrudes from the top surface of the inactive layer 130. Similar to the above embodiment of FIG. 1E, the zinc in the zinc-copper alloy 160 is removed, leaving the nanoporous copper 180. The process of de-alloying is the same as described above with reference to FIG. 1E, and therefore, the detailed description thereof is omitted herein for the sake of brevity. The nanoporous copper 184 of FIG. 1F is electrically connected to the electronic components 122 in the active layer 120 via the interconnects 132 in the inactive layer 130.

Figure 2A:
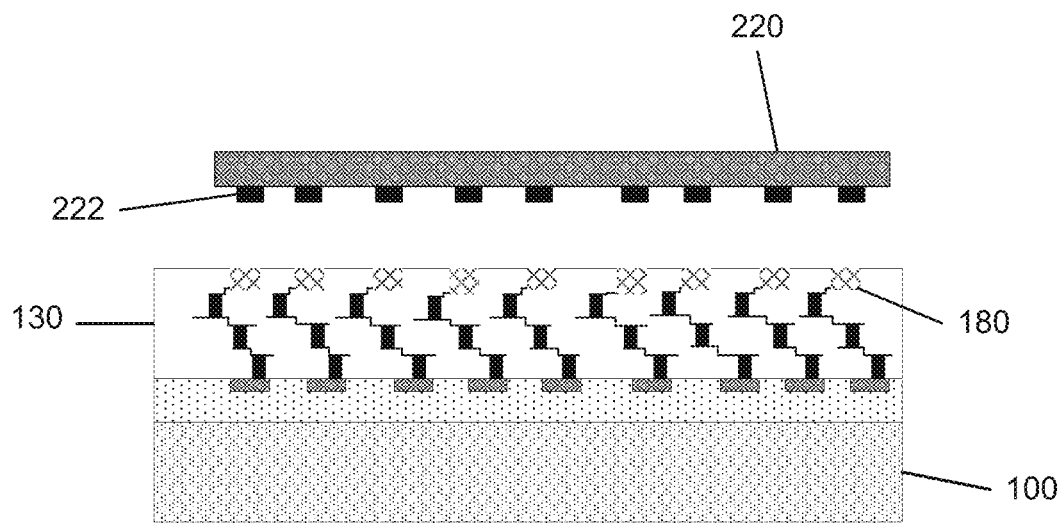
FIG. 2A is a cross-sectional diagram of a first body with its top surface planarized and a second body before assembly, according to one embodiment.

FIG. 2A is a cross-sectional diagram of a second body 220 being attached to the first body 100 where the top surface of the first body 100 is planarized, according to one embodiment. The first body 100 has nanoporous copper interconnects 180 for connecting with electrodes 222 of the second body 220. The second body 220 may be, for example, a light emitting diode with multiple light emitting regions. The second body 220 receives current or voltage signals via the nanoporous copper interconnects 180.

Using the nanoporous copper interconnects 180 to electrically connect components or traces of the first body 100 and the second body 220 is advantageous, among other reasons, because nanoporous materials can be deposited on the first body 100 at a low temperature (e.g., lower than 150° C.). Such low temperature prevents or reduces thermal stress/strain from forming within the first body 100. The use of copper nanoporous material relative to other nanoporous material (e.g., nanoporous gold) is advantageous, among other reasons, because the process of fabricating the nanoporous copper is compatible with a standard complementary metal-oxide-semiconductor (CMOS) process, nanoporous copper is less expensive than nanoporous gold, nanoporous copper has good electrical conductivity, and the mobility of zinc used for fabricating nanoporous copper has lower mobility compared to silver used in fabricating nanoporous gold (therefore, is less likely to cause issues due to migration of less noble metal of the alloy).

The first body 100 is separate from the second body 220 prior to assembly, as shown in FIG. 2A. That is, the first body 210 is physically and electronically disconnected from the second body 220. The electrodes 222 of the second body 220 are aligned with the nanoporous copper interconnects 180, and then the electrodes 222 are pressed into the nanoporous copper interconnects 180. As a result, the nanoporous copper interconnects 180 collapses while forming connections with the electrodes 222.

Figure 2B:
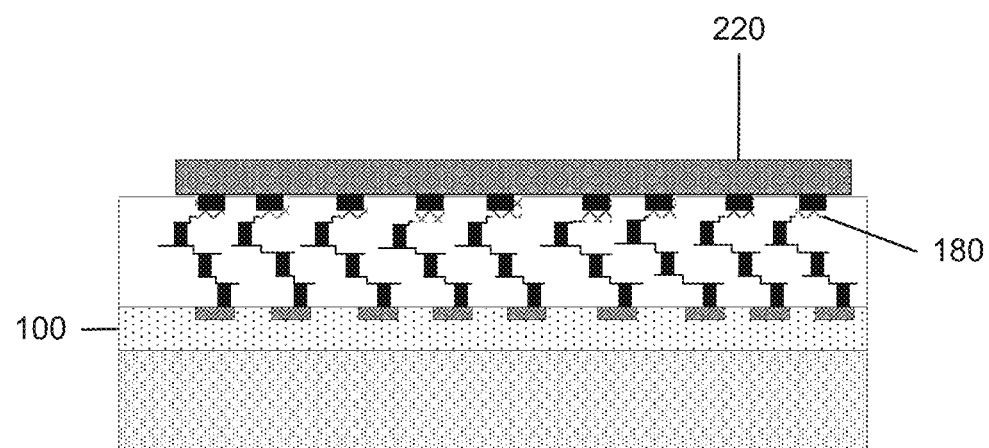
FIG. 2B is a cross-sectional diagram of the first body and the second body of FIG. 2A after assembly, according to one embodiment.

After assembly, the first body 100 is connected to the second body 220 via the nanoporous copper interconnects 180, as shown in FIG. 2B. Due to prior planarization of the nanoporous copper interconnects 180, the second body 220 can be pushed down towards the first body 210 so that the bottom surface of the second body 220 comes into direct contact with the top surface of the first body 100. When both surfaces are made of oxides, the bottom surface of the second body 220 and the top surface of the first body may form covalent bonding. The oxide-oxide covalent bonding advantageously creates a strong contact between the first body 210 and second body 220. Such covalent bonding may advantageously obviate the use of underfill between the first and second bodies 210, 220 while providing a strong bonding.

Figure 3A:
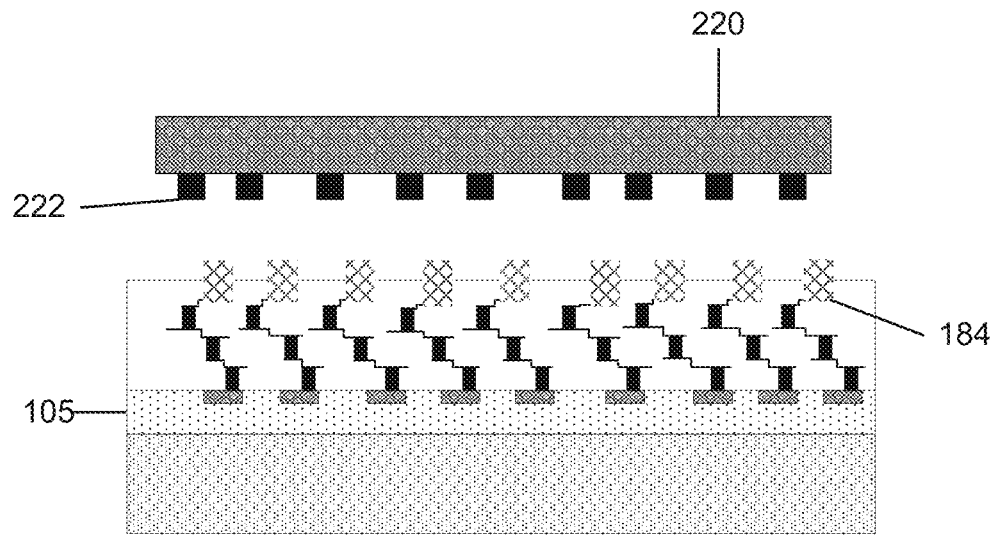
FIG. 3A is a cross-sectional diagram of a first body with its top surface not planarized and a second body before assembly, according to one embodiment.

FIG. 3A is a cross-sectional diagram of a second body 220 attached to the first body 105 where the top surface of the first body 105 is not planarized, according to one embodiment. The nanoporous copper 184 and the top surface of the first body 105 in FIG. 3A is different from The nanoporous copper 180 and the top surface of the first body 100 in FIG. 2A in that the nanoporous copper 184 and the top surface of the first body 105 are not planarized, and therefore, the nanoporous copper 184 protrudes from the top surface of the first body 105.

Figure 3B:
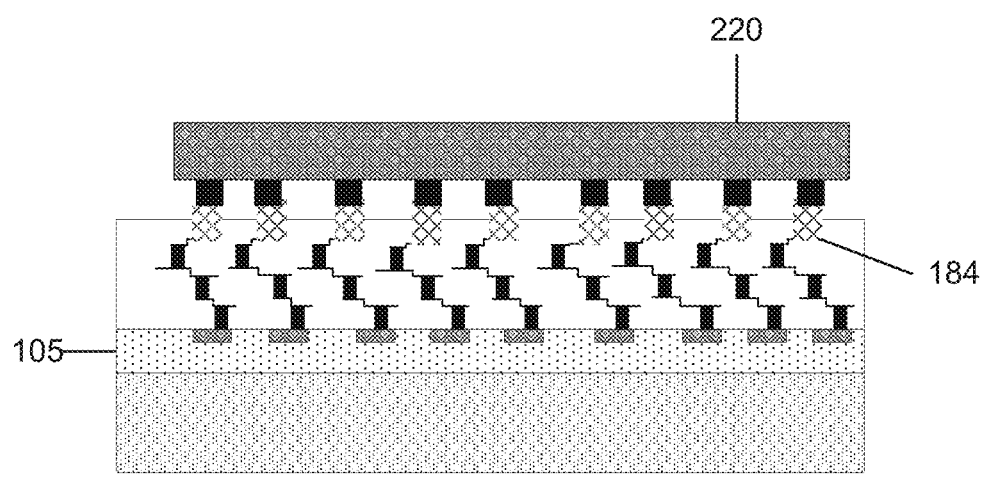
FIG. 3B is a cross-sectional diagram of the first body and the second body of FIG. 3A after assembly, according to one embodiment.

To attach the second body 220 to the first body 105, the electrodes 222 are aligned with the nanoporous copper 184, and then brought into contact. The nanoporous copper 184 may partially collapse and form the assembly as illustrated in FIG. 3B. The electrodes 222 may rest above the recesses in the top surface of the first body 105 as illustrated in FIG. 3B. Alternatively, at least part of the electrodes 222 may rest within the recesses in the top surface of the first body 105. When the electrodes 222 rest within the recesses, the electrodes 222 may advantageously provide resistant to lateral movement of the second body 220 relative to the first body 105.

Figure 3C:
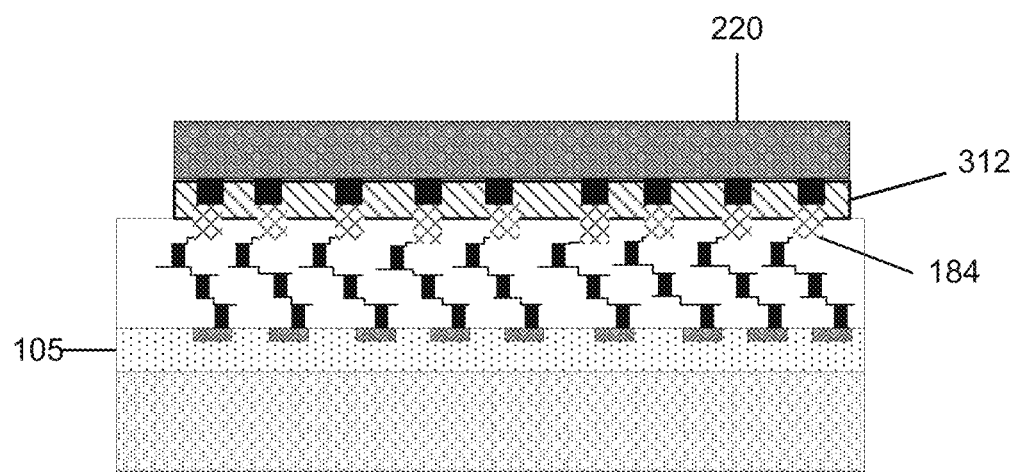
FIG. 3C is a cross-sectional diagram illustrating underfill between the first body and the second body of FIG. 3B, according to one embodiment.

When the electrodes 222 rest above the recesses or only partially embedded in the recesses, the top surface of the first body 105 and the bottom surface of the second body 220 may not come into contact. Hence, no chemical bonding is formed between the top surface of the first body 105 and the bottom surface of the second body 220. To provide sufficient bonding between the first body 105 and the second body 220, underfill 312 may be provided, as illustrated in FIG. 3C. The underfill 312 may be pre-applied to the bottom surface of the second body 220 before assembly onto the first body 105, alternatively the underfill could be applied to the upper surface, or the underfill 312 may be placed between the first body 105 and the second body 220 after their assembly using a transfer molding process.

Figure 4:
FIG. 4 is a flowchart of a method for fabricating an assembly with a first body and a second body electrically connected using nanoporous copper interconnects, according to one embodiment.
Figure 4:

FIG. 4 is a flowchart of a method for fabricating an assembly with a first body and a second body electrically connected using nanoporous copper interconnects, according to one embodiment. One or more recesses are formed 402 on the top surface of a first body, using for example, etching or other removal process. The recesses are electrically connected to the electronic elements or conductive traces in the first body via interconnects that may be made of a copper material.

An alloy including zinc and copper is deposited 403 on at least the recesses. Prior to the deposition of the alloy, a seed layer may be deposited on the surface of the first body to grow the alloy on desired locations of the first body. The desired locations include the recesses and other optional locations on the top surface of the first body. The deposited alloy may protrude from the top surface of the first body (for example, as illustrated in FIG. 1C) or its top surface may be flush with the top surface of the first body (for example, as illustrated in FIG. 1D).

The zinc is removed 404 from the deposited alloy to produce a nanoporous copper material on the recesses. The removal of the zinc may be done by a de-alloying process, such as a corrosion-based electrochemical process.

Figure 5:
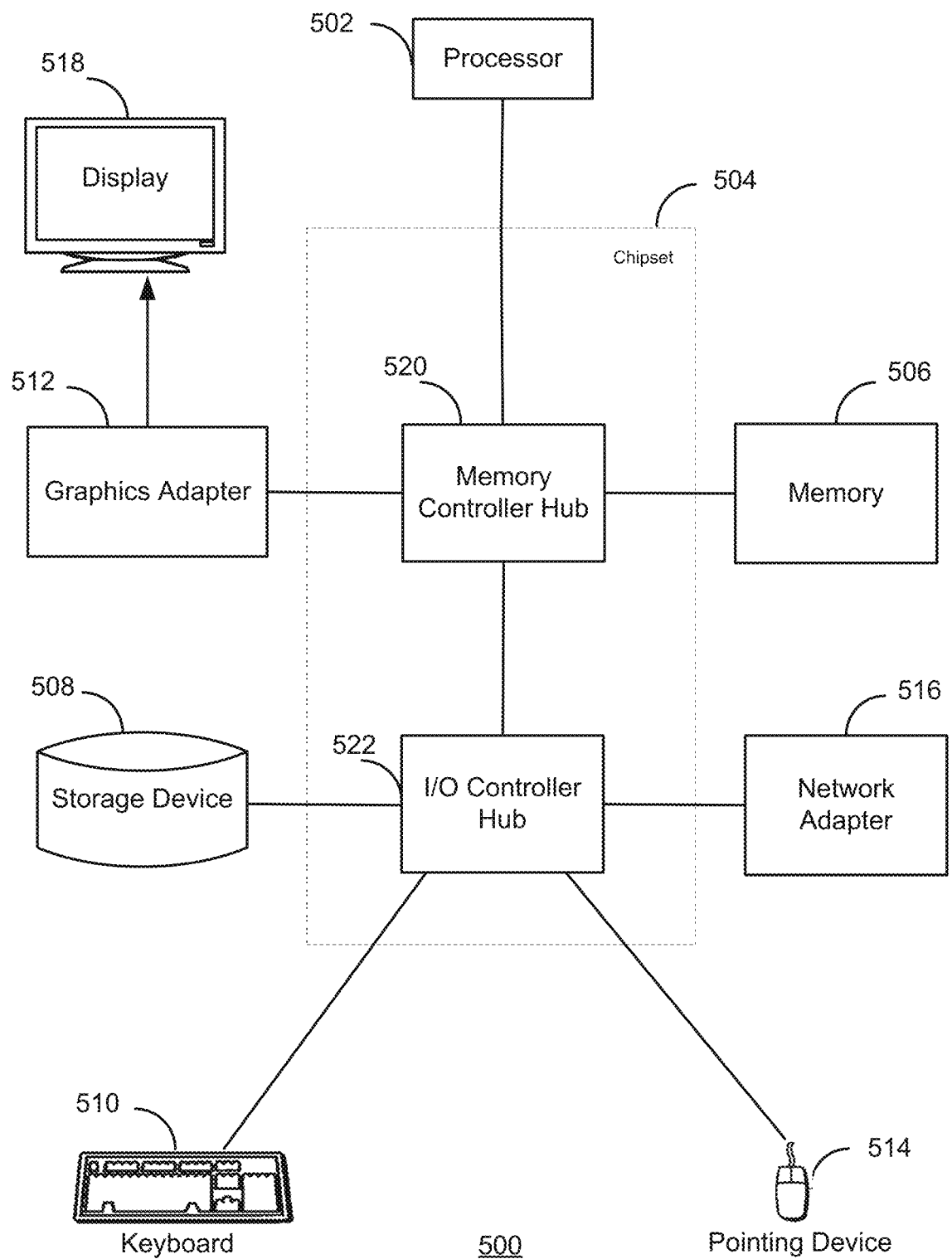
FIG. 5 is a block diagram illustrating a computer system for fabricating an assembly with a first body and a second body electrically connected using nanoporous copper interconnects, according to one embodiment.

FIG. 5 is a block diagram illustrating a computer system for fabricating an assembly with the first body and the second body electrically connected using nanoporous copper interconnects, according to one embodiment. The computer system 500 may be used to control the manufacturing processes discussed herein. For example, the method shown in FIGS. 1A through 1F may be performed under the control of the computer system 500. Illustrated in FIG. 5 are at least one processor 502 coupled to a chipset 504. The chipset 504 includes a memory controller hub 520 and an input/output (I/O) controller hub 522. A memory 506 and a graphics adapter 512 are coupled to the memory controller hub 520, and a display device 518 is coupled to the graphics adapter 512. A storage device 508, keyboard 510, pointing device 514, and network adapter 516 are coupled to the I/O controller hub 522. Other embodiments of the computer system 500 have different architectures. For example, the memory 506 is directly coupled to the processor 502 in some embodiments.

The storage device 508 includes one or more non-transitory computer-readable storage media such as a hard drive, compact disk read-only memory (CD-ROM), DVD, or a solid-state memory device. The memory 506 holds instructions and data used by the processor 502. For example, the memory 506 may store instructions that when executed by the processor 502, configures the processor to perform the processes associated with FIGS. 1A through 3C. The pointing device 514 is used in combination with the keyboard 510 to input data into the computer system 500. The graphics adapter 512 displays images and other information on the display device 518. In some embodiments, the display device 518 includes a touch screen capability for receiving user input and selections. The network adapter 516 couples the computer system 500 to a network. The network may be connected to devices for assembly the first body and the second body according to processes associated with FIGS.

1A through 3C. Some embodiments of the computer system 500 have different and/or other components than those shown in FIG. 5.

The computer system 500 is adapted to execute computer program modules for providing functionality described herein. As used herein, the term "module" refers to computer program instructions and/or other logic used to provide the specified functionality. Thus, a module can be implemented in hardware, firmware, and/or software. In one embodiment, program modules formed of executable computer program instructions are stored on the storage device 508, loaded into the memory 506, and executed by the processor 502. For example, program instructions for the method describe herein can be stored on the storage device 508, loaded into the memory 506, and executed by the processor 502.

Figure 6:
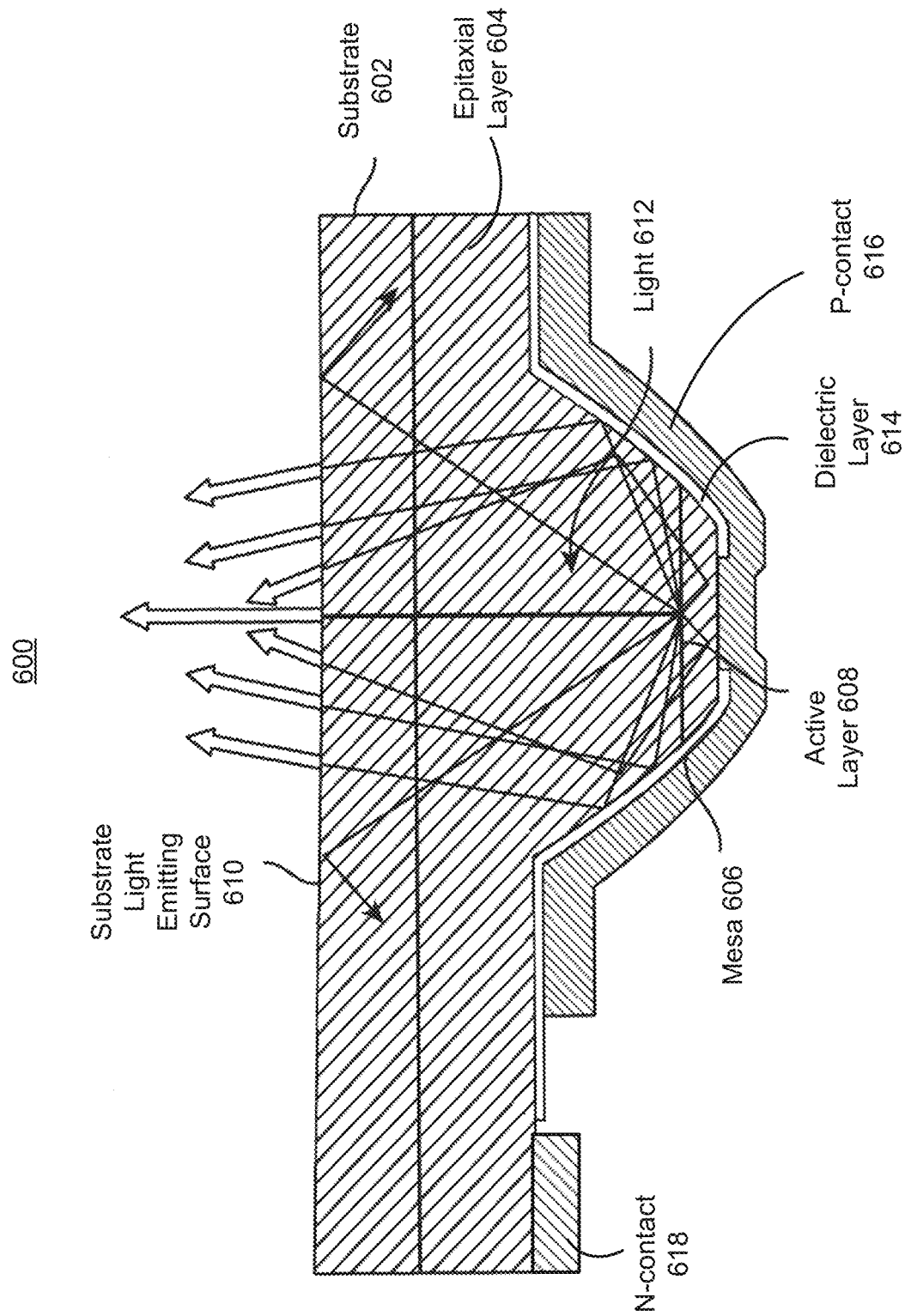
FIG. 6 is a schematic cross section of a micro-LED, in accordance with one embodiment.

FIG. 6 shows a schematic cross section of a micro-LED 600, in accordance with one embodiment. The second body 220 may be embodied as a micro LED 600 including one or more discrete active layers 608. A "μLED" or "micro-LED" described herein refers to a particular type of LED having a small active light emitting area (e.g., less than 2,000 μm$^2$), transparency or substantial transparency to emitted visible light (e.g., from another μLED of another display panel), and collimated light output. In particular, the diameter of each μLED and the pitch, or spacing between μLEDs, is on the order of 0.1-10 μm. The collimated light output increases the brightness level of light emitted from the small active light emitting area. The μLED 600 is an example of an electrode 222 of the second body 220.

The μLED 600 may include, among other components, a LED substrate 602 (or "substrate 602") with a semiconductor epitaxial layer 604 disposed on the substrate 602, a dielectric layer 614 disposed on the epitaxial layer 604, a p-contact 616 disposed on the dielectric layer 614, and an n-contact 618 disposed on the epitaxial layer 604. The epitaxial layer 604 is shaped into a mesa 606. An active (or light emitting) layer 608 (or "active light emitting area") is included in the structure of the mesa 606.

The components of the μLED 600 are transparent or substantially transparent for visible light. For example, the LED substrate 602 may include sapphire, or a glass substrate. The epitaxial layer 604 may include gallium nitride (GaN) or Gallium arsenide (GaAs). The active layer 608 may include indium gallium nitride (InGaN). The type and structure of semiconductor material used may vary to produce μLEDs that emit colors, and may be selected such that the semiconductor material is transparent for the emitted colors of a display panel. The p-contact 616 and n-contact 618 may be contact layers formed from ITO, or some other conductive material that can be transparent at the desired thickness. The transparent or substantially transparent components of the μLED 600 result in the μLED 600 also being transparent or substantially transparent. In various embodiments, other types of transparent or substantially transparent materials can be used for the components of the μLED 600.

The mesa 606 of the epitaxial layer 604 has a truncated top, on a side opposed to a substrate light emitting surface 610 of the substrate 602. The mesa 606 also has a near-parabolic shape to form a reflective enclosure for light generated within the μLED 600. The arrows show how light 612 emitted from the active layer 608 is reflected off the internal walls of the mesa 606 toward the light emitting surface 610 at an angle sufficient for the light to escape the μLED device 600 (i.e., within an angle of total internal reflection). The p-contact 616 and the n-contact 618 electrically connect the μLED 600 to the second body 220.

The parabolic shaped structure of the μLED 600 results in an increase in the extraction efficiency of the μLED 600 into low illumination angles when compared to unshaped or standard LEDs. Standard LED dies generally provide an emission full width half maximum (FWHM) angle of 120°. This is dictated by the Lambertian reflectance from a diffuse surface. In comparison the μLED 600 can be designed to provide controlled emission angle FWHM of less than standard LED dies, such as around 60°. This increased efficiency and collimated output of the μLED 600 can produce light visible to the human eye with only nano-amps of drive current.

The μLED 600 may include an active light emitting area that is less than standard inorganic light emitting diodes (ILEDs), such as less than 2,000 μm$^2$. The μLED 600 directionalizes the light output from the active light emitting area and increases the brightness level of the light output. The μLED 600 may be less than 50 μm in diameter with a parabolic structure (or a similar structure) etched directly onto the LED die during the wafer processing steps to form the quasi-collimated light 612 emerging from the substrate light emitting surface 610.

As used herein, "directionalized light" refers to collimated and quasi-collimated light. For example, directionalized light may be light that is emitted from a light generating region of a LED and at least a portion of the emitted light is directed into a beam having a half angle. This may increase the brightness of the LED in the direction of the beam of light.

A μLED 600 may include a circular cross section when cut along a horizontal plane as shown in FIG. 4. A μLED 600 may have a parabolic structure etched directly onto the LED die during the wafer processing steps. The parabolic structure may include a light emitting region of the μLED 600 to generate light, and the parabolic structure reflects a portion of the generated light to form the quasi-collimated light 612 emitted from the substrate light emitting surface 610.

The foregoing description of the embodiments has been presented for the purpose of illustration; it is not intended to be exhaustive or to limit the patent rights to the precise forms disclosed. Persons skilled in the relevant art can appreciate that many modifications and variations are possible in light of the above disclosure.

The language used in the specification has been principally selected for readability and instructional purposes, and it may not have been selected to delineate or circumscribe the inventive subject matter. It is therefore intended that the scope of the patent rights be limited not by this detailed description, but rather by any claims that issue on an application based hereon. Accordingly, the disclosure of the embodiments is intended to be illustrative, but not limiting, of the scope of the patent rights, which is set forth in the following claims.

What is claimed is:

1. A method comprising:
    forming recesses at a first body for mounting the first body to a second body, the first body comprising an active layer and an inactive layer on top of the active layer, the recesses formed on a top surface of the inactive layer and electrically connected to electronic elements in the active layer via interconnects arranged in the inactive layer, wherein forming the recesses at the first body comprises etching through portions of an oxide layer on the top surface of the inactive layer to form the recesses at the portions of the oxide layer, the interconnects made of a same material;

depositing an alloy comprising copper and zinc on at least the formed recesses to form a layer of the copper-zinc alloy on a surface of the formed recesses using a seed layer on the top surface of the active layer;

removing the zinc from the layer of the copper-zinc alloy to produce, on the recesses, a nanoporous copper interconnects that are directly connected to the interconnects in the inactive layer;

planarizing the nanoporous copper interconnects and the top surface of the first body where the recesses are formed to make the nanoporous copper interconnect flush with the top surface of the first body and remove the seed layer from the top surface of the first body; and collapsing the nanoporous copper interconnects into the recesses by pushing electrodes on the surface of a second body into the recesses.

2. The method of claim 1, further comprising securing the first body and the second body by underfill responsive to collapsing the nanoporous copper interconnects.

3. The method of claim 1, further comprising:
forming the active layer on a substrate;
forming the electronic elements comprising at least portions of the active layers; and
producing the first body by forming the inactive layer on the active layer.

4. The method of claim 1, further comprising depositing a seed layer on the top surface of the first body where the recesses are formed for depositing the alloy.

5. A non-transitory computer-readable storage medium containing instructions executable by a processor, the instructions when executed causing the processor to:

form recesses at a first body for mounting the first body to a second body, the first body comprising an active layer and an inactive layer on top of the active layer, the recesses formed on a top surface of the inactive layer and electrically connected to electronic elements in the active layer via interconnects arranged in the inactive layer, wherein forming the recesses at the first body comprises etching through portions of an oxide layer on the top surface of the inactive layer to form the recesses at the portions of the oxide layer, the interconnects made of a same material;

deposit an alloy comprising copper and zinc on at least the formed recesses to form a layer of the copper-zinc alloy on a surface of the formed recesses using a seed layer on the top surface of the active layer;

remove the zinc from the layer of the copper-zinc alloy to produce, on the recesses, a nanoporous copper interconnects that are directly connected to the interconnects in the inactive layer;

planarize the nanoporous copper interconnects and the top surface of the first body where the recesses are formed to make the nanoporous copper interconnects flush with the top surface of the first body and remove the seed layer from the top surface of the first body; and collapse the nanoporous copper interconnects into the recesses by pushing electrodes on the surface of a second body into the recesses.

* * * * *